(12) United States Patent
Sune

(10) Patent No.: US 6,620,663 B1
(45) Date of Patent: Sep. 16, 2003

(54) SELF-ALIGNED COPPER PLATING/CMP PROCESS FOR RF LATERAL MOS DEVICE

(75) Inventor: Ching-Tzong Sune, Hsin-Chu (TW)

(73) Assignee: Episil Technologies, Inc., Hsin-Chu (TW)

( * ) Notice: Subject to any disclaimer, the term of this patent is extended or adjusted under 35 U.S.C. 154(b) by 51 days.

(21) Appl. No.: 09/859,364

(22) Filed: May 18, 2001

(51) Int. Cl.$^7$ .............................................. H01L 21/338
(52) U.S. Cl. ........................ 438/183; 438/142; 438/151; 438/155; 438/184
(58) Field of Search .................................. 438/142, 151, 438/155, 183, 269, 282, 184, 584, 597, 618

(56) References Cited

U.S. PATENT DOCUMENTS

| | | | | |
|---|---|---|---|---|
| 5,548,150 A | * | 8/1996 | Omura et al. ................ | 257/349 |
| 5,900,663 A | | 5/1999 | Johnson et al. ............. | 257/343 |
| 5,949,104 A | | 9/1999 | D'Anna et al. ............. | 257/335 |
| 5,960,270 A | * | 9/1999 | Misra et al. ................ | 438/197 |
| 6,048,772 A | * | 4/2000 | D'Anna ....................... | 438/301 |
| 6,063,678 A | | 5/2000 | D'Anna ....................... | 438/301 |
| 6,133,610 A | * | 10/2000 | Bolam et al. ................ | 257/349 |
| 6,177,336 B1 | * | 1/2001 | Lin et al. .................... | 438/592 |
| 6,210,999 B1 | * | 4/2001 | Gardner et al. ............. | 438/183 |

* cited by examiner

Primary Examiner—George Fourson
Assistant Examiner—Julio J. Maldonado
(74) Attorney, Agent, or Firm—George O. Saile; Stephen B. Ackerman; Stephen G. Stanton

(57) ABSTRACT

A method of fabricating an RF lateral MOS device, comprising the following steps. A substrate having a gate oxide layer formed thereover is provided. A first layer of polysilicon is formed over the gate oxide layer. A second layer of material is formed over the polysilicon layer. The polysilicon and the second layer of material are patterned to form a gate having exposed sidewalls with the gate having a lower patterned polysilicon layer and an upper patterned second material layer. Sidewall spacers are formed on the exposed sidewalls of the gate. The upper patterned second material layer of the gate is removed to form a cavity above the patterned polysilicon layer and between the sidewall spacers. A planarized copper plug is formed within the cavity.

7 Claims, 3 Drawing Sheets

SELF-ALIGNED COPPER PLATING/CMP PROCESS FOR RF LATERAL MOS DEVICE

FIELD OF THE INVENTION

The present invention relates generally to semiconductor fabrication and more specifically to semiconductor plating/chemical mechanical polishing (CMP) processes.

BACKGROUND OF THE INVENTION

RF MOS devices generally utilize the standard lateral MOS device with a diffused via that connects the source and the body to the back side of the chip such that the backside becomes both the electrical and thermal ground. Some lateral RF MOS devices utilize non-diffusion source-backside connection.

For example, U.S. Pat. No. 6,048,772 to D'Anna describes a method of fabricating a lateral RF MOS device with a non-diffusion source-backside connection between source and drain.

U.S. Pat. No. 5,900,663 to Johnson et al. describes a quasi-mesh gate structure for lateral RF MOS transistor having a conductive plug source-body-backside connection.

U.S. Pat. Nos. 6,063,678 to D'Anna and 5,949,104 to D'Anna each describe lateral RF devices.

SUMMARY OF THE INVENTION

Accordingly, it is an object of the present invention to provide a self-aligned metal plating/CMP process for RF lateral MOS devices.

Another object of the present invention is to provide a self-aligned copper plating/CMP process for RF lateral MOS devices.

A further object of the present invention is to provide a lower cost and simple fabrication self-aligned copper plating/CMP process for RF lateral MOS devices.

Yet another object of the present invention is to provide a self-aligned copper plating/CMP process for RF lateral MOS devices that provides an automatic metal separation between poly, S/D and others by sidewall spacer.

Another object of the present invention is to provide a self-aligned copper plating/CMP process that provides high current density RF lateral MOS devices while shrinking the devices to enhance performance.

Other objects will appear hereinafter.

It has now been discovered that the above and other objects of the present invention may be accomplished in the following manner. Specifically, a substrate having a gate oxide layer formed thereover is provided. A first layer of polysilicon is formed over the gate oxide layer. A second layer of material is formed over the polysilicon layer. The polysilicon and the second layer of material are patterned to form a gate having exposed sidewalls with the gate having a lower patterned polysilicon layer and an upper patterned second material layer. Sidewall spacers are formed on the exposed sidewalls of the gate. The upper patterned second material layer of the gate is removed to form a cavity above the patterned polysilicon layer and between the sidewall spacers. A planarized copper plug is formed within the cavity.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, steps, methods, etc. may be formed or accomplished by conventional steps or methods known in the prior art.

Initial Structure

Figure 1:
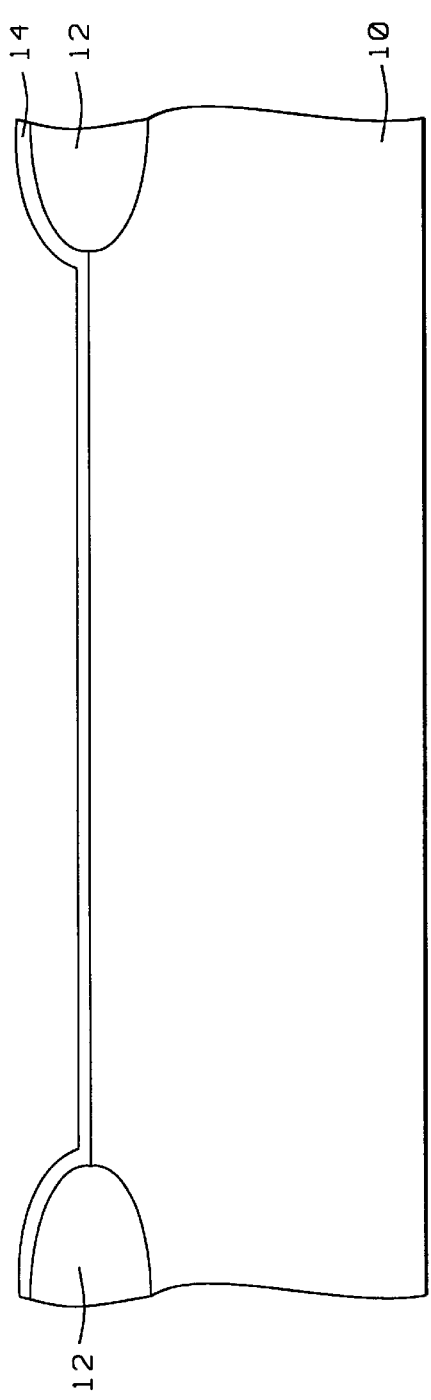
FIGS. 1 through 4 illustrate a preferred embodiment of the present invention.

FIG. 1 illustrates a substrate 10, preferably silicon substrate that may be a semiconductor substrate, having shallow trench isolation areas (STIs) or LOCOS (local oxidation silicon) 12 formed therein. Gate oxide 14 is formed over semiconductor substrate 10 and STIs 12 to a thickness of preferably from about 100 to 1000 Å and more preferably from about 250 to 600 Å.

Formation of Gates/Implants

Figure 2:
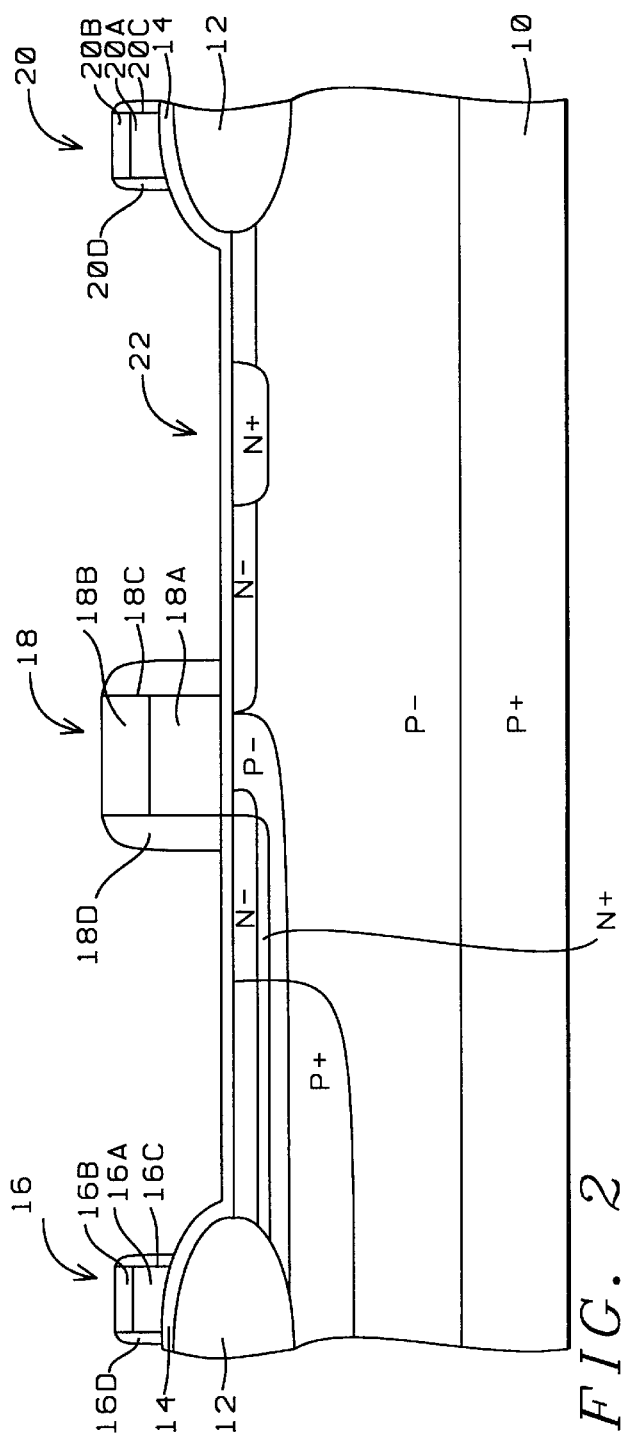
Figure 3:
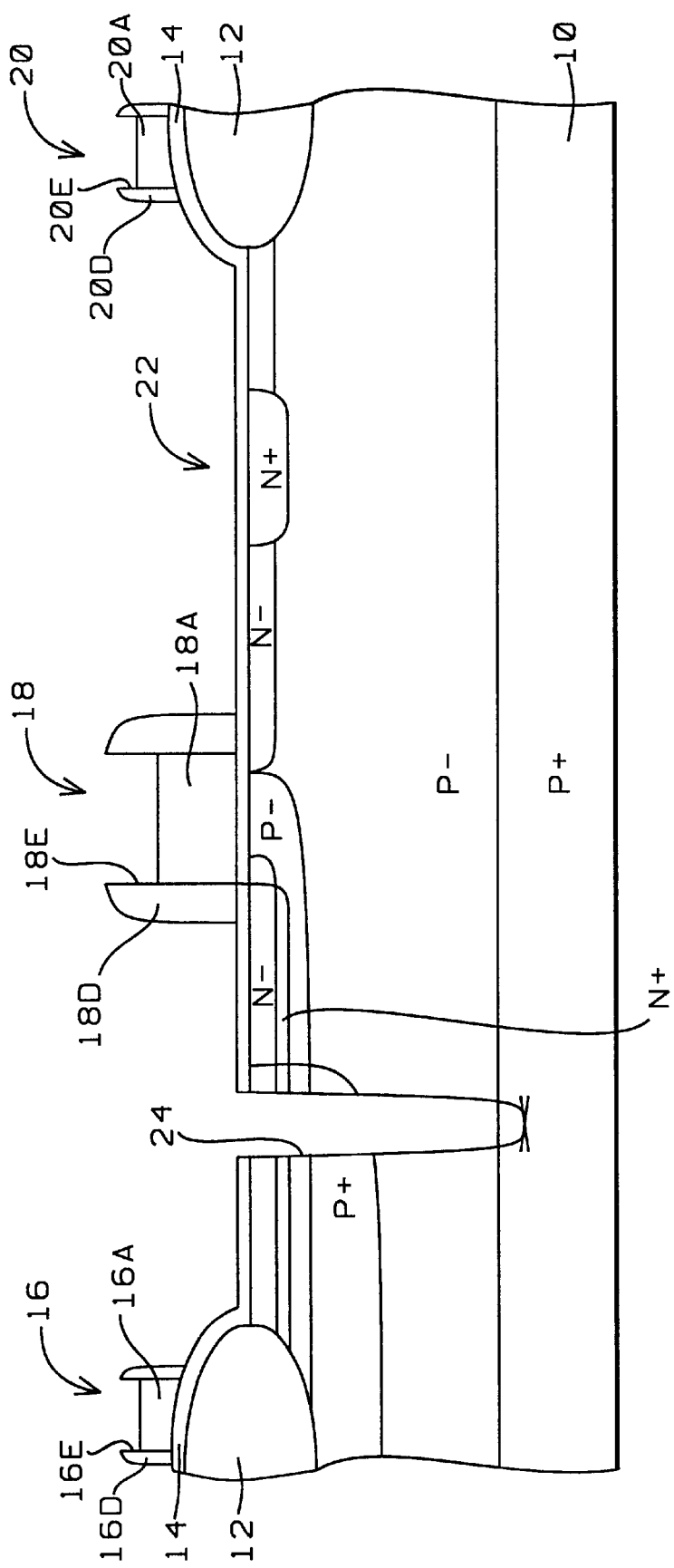

As shown in FIG. 2, a layer of polysilicon is deposited over gate oxide 14 to a thickness of preferably from about 2000 to 5000 Å and more preferably from about 2000 to 3000 Å; then a second layer is deposited over the polysilicon layer to a thickness of preferably from about 2000 to 5000 Å and more preferably from about 2000 to 4000 Å. The second layer may be comprised of LP-TEOS, Si-rich oxide, nitride or silicon nitride (SiN) and is more preferably comprised of SiN.

The SiN layer and the polysilicon layer are then patterned to form gates 16, 18, 20 each having a lower patterned polysilicon layer 16A, 18A, 20A and an upper patterned SiN layer 16B, 18B, 20B and each having exposed sidewalls 16C, 18C, 20C.

Sidewall spacers 16D, 18D, 20D are then formed over the exposed sidewalls 16C, 18C, 20C of gates 16, 18, 20, respectively. Sidewalls by preferably forming a sidewall layer over gate oxide 14 and gates 16, 18, 20 and then etching the sidewall layer to form sidewall spacers 16D, 18D, 20D. Sidewall spacers 16D, 18D, 20D may be comprised of LPCVD TEOS (low pressure chemical vapor deposition tetraethylorthosilicate), LTO (low temperature oxide), nitride or SiN and are more preferably comprised of LPCVD TEOS. Sidewall spacers 16D, 18D, 20D are preferably from about 600 to 2500 Å wide and are more preferably from about 1000 to 2000 Å wide.

The top second layers 16B, 18B, 20B and sidewall spacers 16D, 18D, 20D should be selected from paired materials that have different etching rates, preferably with at least about a 5 : 1 differing etch rates. For example: SiN top second layers 16B, 18B, 20B with LP-TEOS sidewall spacers 16D, 18D, 20D; or LP-TEOS top second layers 16B, 18B, 20B with SiN sidewall spacers 16D, 18D, 20D. This facilitates the use of chemical mechanical polishing (CMP) to planarize copper layer 26 and yet to separate the copper (metal) 16F, 18F, 20F and 26 automatically by the sidewall spacers 16D, 18D, 20D (see below—FIG. 4).

It is noted that conventional RF lateral MOS implants may be formed by conventional methods as shown in FIG. 2, including an $N^+$implant at drain region 22.

Trench 24 Etch and Removal of Upper Patterned SiN Layers 16B, 18B, 20B

Source trench 24 is then etched through gate oxide 14 and into silicon semiconductor substrate 10 and serves to connect each source area and body contact to substrate 10.

In a key step of the invention, upper patterned SiN layers 16B, 18B, 20B of gates 16, 18, 20, respectively, are removed preferably by phosphoric acid ($H_3PO_4$) to leave cavities 16E, 18E, 20E overlying lower patterned polysilicon layers 16A, 18A, 20A, respectively, of gates 16, 18, 20, respectively.

Formation of Self-Aligned, Planarized Copper Layer 26

A coating seed layer (not shown) may then be formed over the structure by sputtering or chemical vapor deposition (CVD), lining: source trench 24; cavities 16E, 18E, 20E overlying lower patterned polysilicon layers 16A, 18A, 20A, respectively, of gates 16, 18, 20, respectively; exposed side wall spacers 16D, 18D, 20D; and exposed gate oxide 14. The seed layer is preferably from about 100 to 2000 Å thick, and more preferably from about 200 to 500 Å. The seed layer is preferably comprised of Ti/TiN/Cu, Ti/TiN/Al and is more preferably comprised of Ti/TiN/Cu.

In another key step of the invention, copper layer 26 is then deposited upon the seed layer, to a thickness at least as high as gates 16, 18, 20, filling source trench 24, and cavities 16E, 18E, 20E overlying lower patterned polysilicon layers 16A, 18A, 20A, respectively, of gates 16, 18, 20, respectively. Copper layer 26 is also preferably deposited by a plating.

Figure 4:
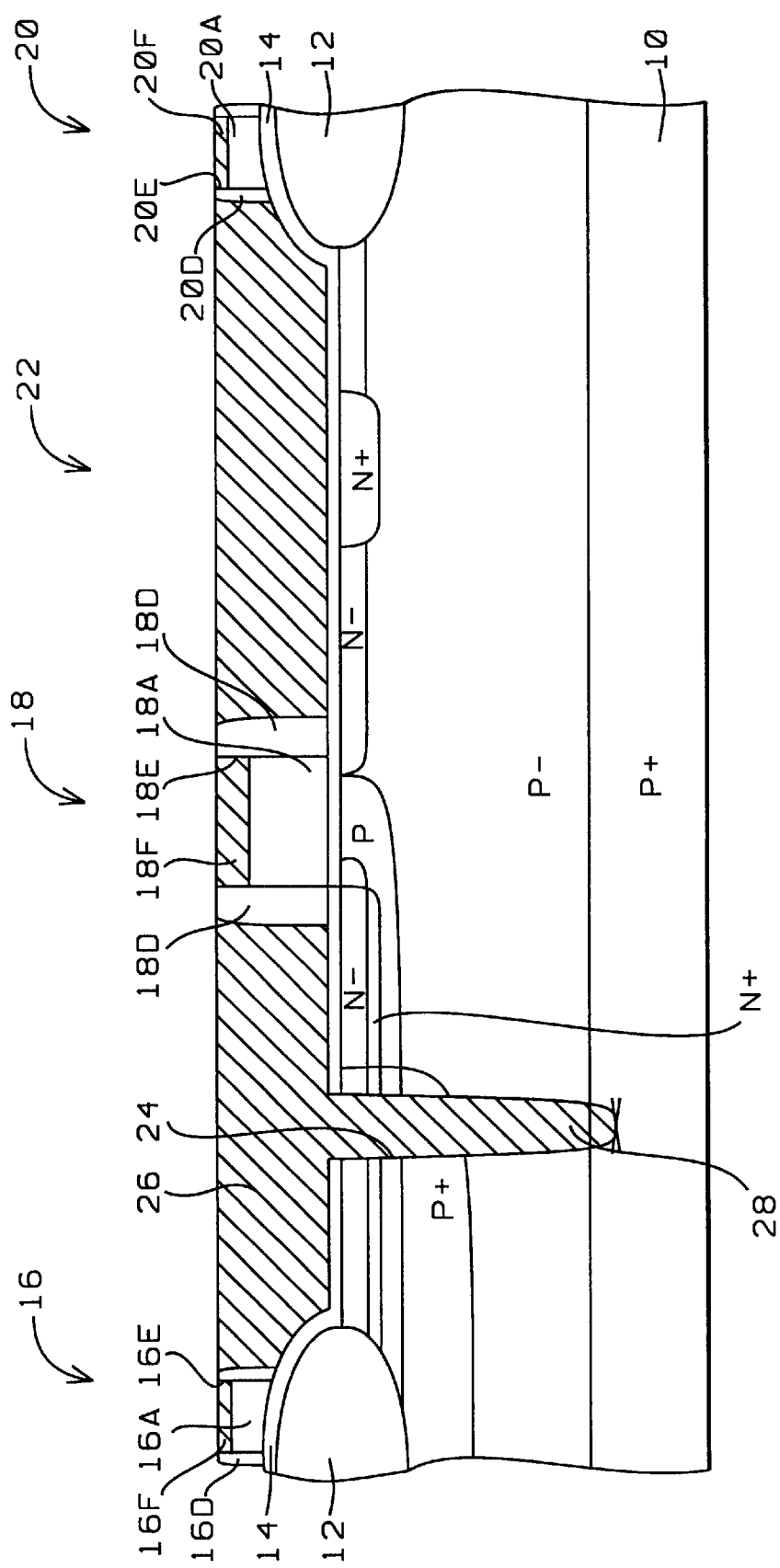

Copper layer 26 is then planarized, preferably by chemical mechanical polishing (CMP) to form self-aligned, planarized copper plugs 16F, 18F, 20F within cavities 16E, 18E, 20E overlying lower patterned polysilicon layers 16A, 18A, 20A, respectively, of gates 16, 18, 20, respectively. Source trench 24 is filled with copper plug portion 28 of planarized copper layer 26. As shown in FIG. 4, sidewall spacers 16D, 18D, 20D separate planarized copper plugs 16F, 18F, 20F within cavities 16E, 18E, 20E and planarized copper layer 26.

Copper plugs 16F, 18F, 20F within cavities 16E;, 18E, 20E thus formed are self-aligned, and the copper has a low resistivity and a higher current density so the sizes of gates 16, 18, 20 may be shrunk therefore increasing frequency and power of RF lateral MOS devices.

The self-aligned process of the present invention also achieves low fabrication costs by eliminating several photolithography and etching steps of prior processes.

Advantages of the Present Invention

The advantages of the present invention include:

1) smaller sizes of RF lateral MOS devices are achievable;.
2) RF. lateral MOS device frequency may be increased;
3) the fabrication process is available in current IC industry and matured;
4) the fabrication process is simplified and is of lower cost; and
5) the fabrication process eliminates the etching and photolithography problem of copper which is required for high current density.

While particular embodiments of the present invention have been illustrated and described, it is not intended to limit the invention, except as defined by the following claims.

I claim:

1. A method of fabricating an RF lateral MOS device, comprising the steps of:
    providing a substrate having a gate oxide layer formed thereover;
    forming a first layer of polysilicon over the gate oxide layer;
    forming a second layer of material over the polysilicon layer;
    patterning the polysilicon and the second layer of material to form a gate having exposed sidewalls, the gate having a lower patterned polysilicon layer and an upper patterned second material layer;
    forming sidewall spacers on the exposed sidewalls of the gate;
    forming a source/drain contacts adjacent to the sidewall spacers;
    removing the upper patterned second material layer of the gate to form a cavity above the patterned polysilicon layer and between the sidewall spacers;
    forming a source trench through the gate oxide layer and into the substrate adjacent the gate;
    forming a blanket conductive layer over the substrate; and
    planarizing the blanket conductive layer to simultaneously form:
    a) a plug within the cavity;
    b) a source plug portion within the source trench; and
    c) a drain plug portion overlying the drain region.

2. The method of claim 1, including the step of forming implants within the substrate.

3. The method of claim 1, wherein the second layer of material is comprised of a material selected from the group consisting of LP-TEOS, Si-rich oxide, nitride and SiN; and the sidewall spacers are comprised of a material selected from the group consisting of LPCVD TEOS, LTO, nitride and SiN.

4. The method of claim 1, wherein the second layer of material is comprised of a material selected from the group consisting of nitride and silicon nitride; and the sidewall spacers are comprised of LPCVD TEOS.

5. The method of claim 1, wherein the gate oxide layer is from about 100 to 1000 Å thick; the patterned polysilicon layer is from about 2000 to 5000 Å thick; the patterned second layer of material is from about 2000 to 5000 Å thick; and the sidewall spacers are from about 600 to 2500 Å wide.

6. The method of claim 1, wherein the gate oxide layer is from about 250 to 600 Å thick; the patterned polysilicon layer is from about 2000 to 3000 Å thick; the patterned second layer of material is from about 2000 to 4000 Å thick; and the sidewall spacers are from about 1000 to 2000 Å wide.

7. The method of claim 1, wherein the blanket conductive layer is comprised of copper.

* * * * *